United States Patent [19]

Yokouchi et al.

[11] 4,346,516
[45] Aug. 31, 1982

[54] METHOD OF FORMING A CERAMIC CIRCUIT SUBSTRATE

[75] Inventors: Kishio Yokouchi, Koganei; Hiromi Ogawa; Hiromitsu Yokoyama, both of Yokohama; Nobuo Kamehara, Machida; Koichi Niwa, Tama; Kyohei Murakawa, Yokohama, all of Japan

[73] Assignee: Fujitsu Limited, Kawasaki, Japan

[21] Appl. No.: 252,214

[22] Filed: Apr. 8, 1981

[51] Int. Cl.$^3$ .......................... H05K 3/00; H05K 3/36
[52] U.S. Cl. ............................ 29/845; 29/148.4 B; 100/295; 264/22; 264/61; 264/241; 264/259; 264/263; 264/319; 264/511
[58] Field of Search ........................ 264/22, 61, 62, 241, 264/259, 263, 273, 277, 319, 511; 100/295; 29/845, 877, 885, 148.4 B

[56] References Cited

U.S. PATENT DOCUMENTS

| | | | |
|---|---|---|---|
| 3,075,281 | 1/1963 | Spooner | 29/877 |
| 3,397,453 | 8/1968 | Gwyn, Jr. | 29/877 |
| 3,808,681 | 5/1974 | Law et al. | 29/877 |
| 4,050,756 | 9/1977 | Moore | 29/845 |
| 4,067,945 | 1/1978 | DuRocher | 264/156 |
| 4,109,377 | 8/1978 | Blazick et al. | 264/61 |

OTHER PUBLICATIONS

IBM Multichip Multilayer Ceramic Modules for LSI Chips–"Designed for Performance and Density"–IEEE Transaction, 1980, vol. CHMTS, No. 3, No. 1, Mar. 1980.

*Primary Examiner*—Donald E. Czaja
*Assistant Examiner*—W. Thompson
*Attorney, Agent, or Firm*—Staas & Halsey

[57] ABSTRACT

A method of forming a ceramic circuit substrate allowing mounting of high integration density semiconductor elements. The method provides a multilayered ceramic circuit substrate having via holes formed with high accuracy and high integration density wiring patterns by forming metallic conductive balls to connect the conductive wiring patterns of upper and lower layers; a ball arranging plate having many holes placing on a green sheet uniformly in close contact; filling the holes of the plate with the embedding the conductive balls by pressure into the green sheet; and thereafter baking the green sheet individually or in a stacked layered arrangement.

19 Claims, 19 Drawing Figures

METHOD OF FORMING A CERAMIC CIRCUIT SUBSTRATE

BACKGROUND OF THE INVENTION

1. Field of the Invention

This invention relates to a method of forming a high density ceramic circuit substrate suitable for mounting semiconductor elements, such as ICs and LSIs, and more particularly to a method of manufacturing a ceramic circuit substrate involving formation of a via hole for interlayer connection of the circuit.

2. Description of the Prior Art

With the progress in computer design to reduce size and integration density of the circuits, circuit mounting substrates are more and more being scrutinized with respect to wiring patterns and increasingly becoming more multi-layered.

Currently, in order to obtain a circuit substrate of this type, a so-called resin substrate is employed, where the resin, such as epoxy, polyimide, etc., is impregnated into the glass-cloth.

But, recently, a ceramic substrate having certain excellent property characteristics is being considered as a replacement for the resin substrate and research is now occurring for obtaining effective improvement in and utilization of the ceramic substrate.

A ceramic substrate provides various properties for achieving a high density circuit pattern because it has little thermal aging variation, has high intensity for external stress and sustains high surface smoothness since the material itself is very stable. Therefore, bare semiconductor element chips can be directly connected and mounted, such as by the wire bonding method, on the ceramic substrate. This is unlike the conventional method where parts are mounted on the resin substrate, namely using a mounting method where the molded IC or LSI in ceramic packages are mounted on the substrate. Resultingly, there is an improved density of the elements to be mounted and increased scrutinization of the circuit patterns. Moreover, since a ceramic substrate employs an inter-layer connecting method where a via hole is provided, namely a hole bored on a layer substrate and then a metallic paste filled in the hole, it provides an a blind through hole that can be formed very easily and resultingly, the wiring density in the thickness direction of substrate can be increased. This is unlike the inter-layer connecting method where a through hole is bored on the multi-layered resin substrate, namely a through hole bored after stacking the layers for the multi-layered resin substrate and then conductive plating carried out for this through hole. A circuit structure utilizing the ceramic substrate is disclosed, for example, in "IBM Multichip Multilayer Ceramic modules for LSI chips-Design for Performance and density-" of "IEEE Transaction, 1980 Vol. CHMT3, No. 3, No. 1, March, 1980".

However, the ceramic circuit substrate of this type has disadvantages in that formation of the aforementioned via hole is troublesome and moreover it is impossible to expect highly accurate formation.

Namely, formation of a via hole usually requires two steps in the process, including the boring onto the substrate and filling of metallic paste into the hole.

The boring step is normally performed using a laser beam, but a long boring time is required for beam irradiation and beam deflection scanning. Moreover, the step of filling of the via hole with metallic paste is frequently not carried out accurately and firmly.

SUMMARY OF THE INVENTION

The present invention has been proposed to overcome the problems described with respect to the above background, and it is an object of the present invention to offer a novel method of forming a ceramic circuit substrate which assures formation of the Via Hole by only one step.

It is another object of the present invention to offer a method of forming a ceramic circuit substrate which assures formation of a large number of Via Holes with excellent accuracy.

it is a further object of the present invention to offer a method of forming a ceramic circuit substrate which is quite suitable for automatic production, and resultingly suitable for mass-production.

The present invention has solved the problems of the conventional method of forming a ceramic circuit substrate by the following method: a mold setting process where a mold having many holes larger than the outer diameter of a conductive ball is set on a green sheet placed on a tray; a contact process where the green sheet and mold are placed in close contact; a filling process where the conductive balls are filled in the holes on the mold; a pressurizing process where the conductive balls filled in the holes are embedded into the green sheet and a baking process where the green sheet is baked.

According to the present invention, the conductive balls preferably made of gold are orderly arranged on the green sheet using a mold, the conductive balls are then pressured into the green sheet after the mold and green sheet are placed in close contact and by using an external force, and thereafter they are baked. Therefore, the conventional problems in the two steps of boring and filling via holes are overcome.

BRIEF DESCRIPTION OF THE DRAWING

FIG. 13 is a vertical sectional view and FIG. 14 is a plan view of the same embodiment.

DETAILED DESCRIPTION OF THE PREFERRED EMBODIMENT

With progress in making semiconductor elements, such as IC's and LSI's in high integration density, the circuit substrate for mounting these packaged elements requires higher wiring density. For this purpose, scrutinization of lead wire width and formation of a multilayer structure of the conductor circuit are attempted. For a ceramic mounting circuit substrate, the formation of via holes for inter-layer connection of the multi-layered substrate is classified usually into the two processes or steps of boring the via hole and filling the via hole with a metallic paste.

A puncher drill or laser beam apparatus is used for boring of the raw sheet. However, the boring process by either of two means is not satisfactory. For example, boring by a puncher drill is limited in diameter to a smallness of 0.5 mm$\phi$. It is also difficult to obtain the punching mold and drill which assures an excellent boring accuracy. On the other hand, the laser beam facilitates boring to a diameter of 0.1 mm$\phi$, but requires a longer boring period and does not provide a satisfactory finish or accuracy of the bored hole.

Figure 1:
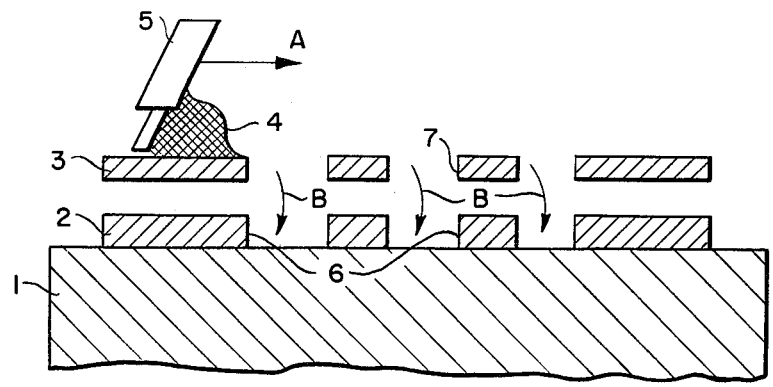
FIG. 1 illustrates a conventional method of forming a ceramic circuit substrate.

With via holes formed in above-mentioned the manner in a green sheet, the bored green sheet 2 is mounted on a tray, 1, as shown in FIG. 1. A separate hole filling screen 3 is positioned in close contact with green sheet 2. Then a conductor paste 4 is coated at the internal side of a via hole 6 of the green sheet 2 through the movement of a stage 5 on the screen 3. In this case, it is difficult to align the hole 6 bored on the raw sheet 2 and the coating position 7 of the screen 3. Low accuracy in this alignment brings about a problem on scrutinization of the via hole.

In, the case of present invention, boring and filling are in essence carried out at one time, and the via holes are formed on the green sheet in a single process. Basically, many conductive balls are arranged on a green sheet, pressed all at one time and thereby embedded into the green sheet.

Figure 2:
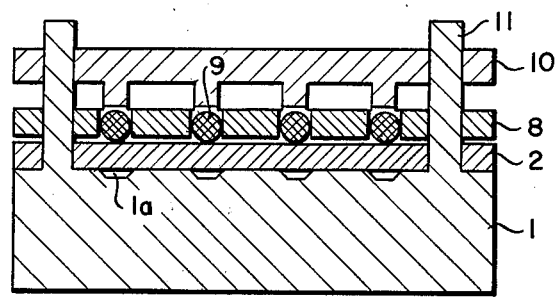
FIG. 2 is an embodiment of an apparatus for forming the via hole employed in the present invention.

FIG. 2 shows an embodiment of an apparatus for forming the via holes used in the present invention.

In this figure, reference numeral 10 is a force piston, 8 is a ball arranging plate, 9 is a conductive ball of 0.1 mm$\phi$, 2 is the green sheet in the thickness of 0.12 mm, 1 is a tray, 1a is a dent of the tray, 10 is a force piston and 11 is an alignment pin.

Firstly, the green sheet 2 is placed on the tray 1, and the ball arranging plate 8 is placed on the green sheet 2. At this time, since the alignment pin 11 passes through the green sheet 2 and the alignment hole pre-formed on the ball arranging plate 8, the green sheet 2 and ball arranging plate 8 are placed in a specified location.

Then, many conductive balls 9, preferably metallic balls made of Au, are arranged on the ball arranging plate 8 and it is then vibrated. The metallic balls 9 are thereby filled automatically in the tapered holes of the ball arranging plate 8 and the extra metallic balls 9 are removed. The force piston 10 is positioned above the ball arranging plate 8 and is engaged with the alignment pins 11 provided at the four corners of the tray 1.

Figure 3:
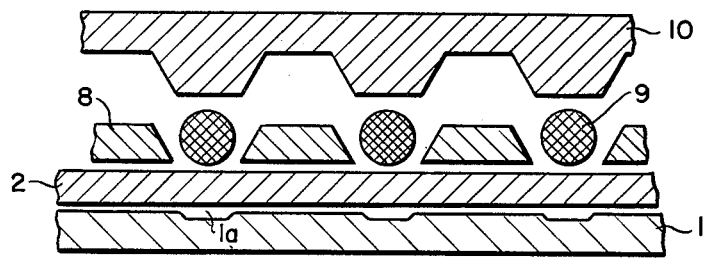
FIG. 3 is the a partly enlarged sectional view of FIG. 2 showing the apparatus in a first operating condition.

FIG. 3 is a sectional view of the area in the vicinity of the balls in the above-described steps.

Figure 4:
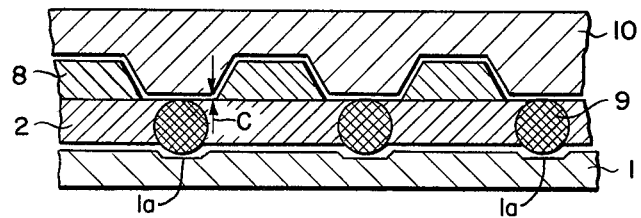
FIG. 4 is a partly enlarged sectional view similar to FIG. 3, but showing the apparatus in a second operating condition.

Then, the apparatus with the force piston as a whole is heated up to 80° C. and pressurized for five minutes with a pressure of 100 kg/cm$^2$ by a hydraulic press machine. Thereby, as shown in FIG. 4, the metallic balls 9 are formed into the green sheet 2 and drop to the dent 1a (0.05 mm in this embodiment) of the tray 1 when the upper parts of metallic balls 9 come into contact with the force piston 10. A clearance C between the force piston 10 and the green sheet 2 is formed and, thus, the ball arranging plate 8 to some extent pushes against the green sheet 2.

In the next step, when the force piston 10, ball arranging plate 8 and tray 1 are all reset, the via holes are formed where the metallic balls 9 are filled in the green sheet 2.

On a green sheet 2 where the via holes are formed as explained above, the conductor wiring pattern of a thick film is formed and then these sheets are stacked by a press into a multi-layered body and baked under a temperature of 900° C. Thereby, a multi-layered circuit substrate can be obtained.

Use of an excessively high temperature in the step of embedding the metallic balls 9 into the green sheet 2 will deteriorate the green sheet 2. Therefore the optimum temperature is 80° to 100° C. Moreover, materials which are resistive to heat and suitable for etching are referred for the force piston 10, ball arranging plate 8 and tray 1. For example, these components can be obtained by making them of and etching a stainless steel or Mo plate, etc. The referred pressure to be applied for embedding the metallic ball is within the range of from 100 to 150 kg/cm$^2$. If a pressure higher than such range is used, the metallic ball (Au) may be destroyed.

Of course, it is desirable that the metallic balls have the same size. However the balls made of Au obtained in the market have had low uniformity in size. Therefore, it is desirable to provide a process for making a metallic ball having excellent uniformity in size.

A fine lead consisting of gold (Au) having a purity of 99.9% is cut into segments of specified length. These segments are arranged on a heat resistant plate, such as an alumina block. This plate is first positioned horizontally in a furnace under atmospheric pressure, then the furnace temperature is increased up to 1080° C. (a temperature higher than the melting point of Au) at a rate of 700° C./hour, and finally this temperature is held for 100 minutes. The Au segment cut in the specified length is thereby melted on the plate and then formed into spheres.

When the furnace temperature is lowered to the normal temperature at a rate of 500° C./hour, the melted gold solidifies thus forming a Au ball.

Figure 5:
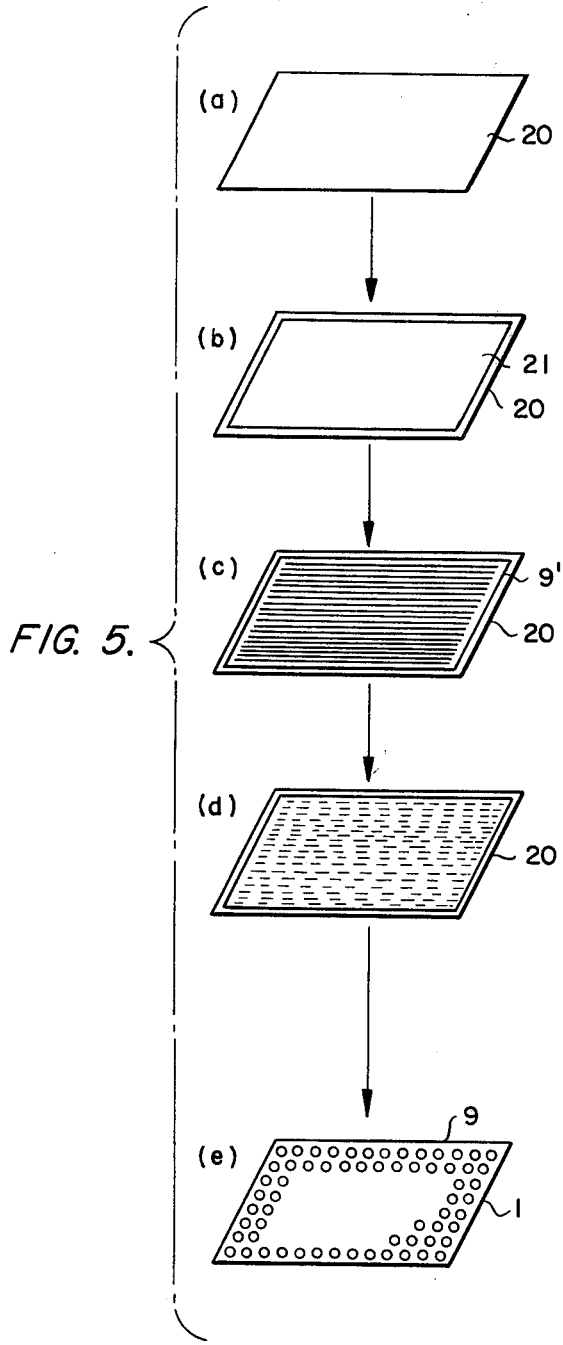
FIGS. 5(a) to (e) show a practical embodiment of a conductive ball producing process employed in the present invention.

FIG. 5 shows a practical embodiment of a method of producing the balls consisting of Au based on the foregoing principle.

FIG. 5(a) shows a heat resistant substrate 20. First, a bonding agent 21 is coated on this substrate 20 as indicated in FIG. 5(b). Then, many fine leads of Au 9' are arranged, as shown in FIG. 5(c). These fine leads of Au 9' are then cut into the specified length as shown in FIG. 5(d). In this case, since the leads 9' of Au adhere to the substrate 20 by means of the bonding agent 21, cutting can be done without disturbing the arrangement of fine leads of the Au. Then, the substrate 20 is subjected to the thermal process in the manner as explained above together with the fine cut leads of Au. Thereby, the Au balls 9 can be obtained as shown in FIG. 5(e). In this case, the Au balls of the desired diameter can be obtained by adequately selecting the cutting length of the fine leads of Au. The relation between the size of the ball and the cutting length is shown in the table below. For example, when the fine lead of Au in the diameter of 100ϕ μm is cut into a segment with a length of 34 μm, the Au ball having a size of a 80ϕ μm can be obtained.

| | Cutting length of Au fine lead (μm) | | |
| --- | --- | --- | --- |
| | Diameter of Au fine lead used | | |
| Ball diameter | 100 | 50 | 30 |
| 80 μm | 34 | 136 | 379 |
| 100 | 66 | 266 | 740 |
| 120 | 115 | 460 | 1280 |
| 150 | 225 | 900 | 2500 |
| 200 | 533 | 2133 | 5925 |

The surface roughness of various substrates used for producing such Au balls is as follow.

| Kind of substrate | Roughness | Adequacy of ball |
| --- | --- | --- |
| FGA substrate | 0.15 μm | Adequate |
| Marketed substrate | 0.4 | Adequate |
| Marketed block | 10 | Adequate |

When the surface roughness is within the range from $R_{max}$ 0.1 to 10 μm, a ball can be obtained. However, the maximum roughness is $R_{max}$ 7 to 10 μm.

The Au balls thus obtained have little size variation and have the desired ball diameter.

Figure 6:
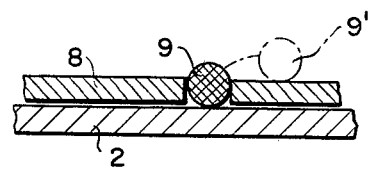
FIGS. 6, 7, 8, and 9 explain the layout of the ball arranging plate and balls for use in embedding the balls into the green sheet.
Figure 7:
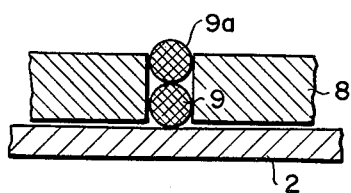

After forming metallic balls of Au having a uniform size, the next object is to accurately arrange the metallic balls for embedding into the substrate. For the arrangement of the balls, the abovementioned ball arranging plate 8 is used. If this ball arranging plate 8 is too thin, such as shown in FIG. 6, the metallic balls 9 are not guided into the holes on the ball arranging plate 8. However, if the plate is too thick, such as shown in FIG. 7, two or more balls 9 and 9a enter a hole of the ball arranging plate 8. Both of the above phenomenona are not satisfactory. Therefore, the ball arranging plate 8 is required to have a thickness similar to the diameter of ball 9.

Figure 8:
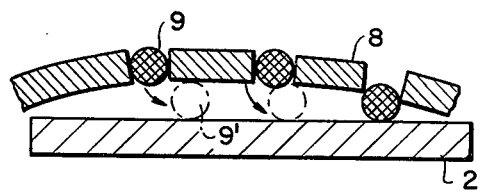
Figure 10:
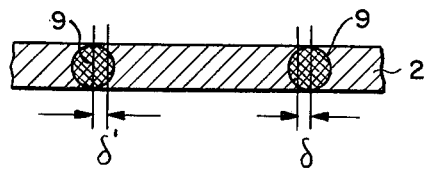
FIG. 10 shows the condition of the balls embedded into the green sheet by pressurization.

However, this requirement results in the following problem that since the diameter of metallic ball 9 is small, for example 80 μm, the ball arranging plate 8 used for arranging the metallic balls becomes thin in the same degree thus deformation in the plate can occur with a weak external force and a clearance formed between the ball arranging plate 8 and green sheet 2 which should essentially be placed in close contact. Therefore the metalic ball 9 may not be positioned properly in the hole of the ball arranging plate 8 as indicated by 9' in FIG. 8, and resultingly the ball not embedded in the specified location on the green sheet 2. FIG. 2 shows the profile, where the ball arranging plate 8 is deformed in a direction opposite to that shown in FIG. 8. In this case also, the metallic ball 9 are not arranged in their specified locations. As a result, as shown in FIG. 10, the metallic balls 9 are embedded in the green sheet 2 in locations respectively displaced by δ,δ' from their specified locations. Stacking of a plurality of such green sheets 2 into a multi-layer substrate will not obtain the sufficient electrical continuity between the upper and lower layers.

Thus, the method of forming a ceramic circuit substrate of the present invention comprises a step for preventing generation of such displacement of balls, namely a close contact process or step where the green sheet 2 is placed in close contact with the ball arranging plate 8 by applying an external force, such as a pneumatic, vacuum or magnetic force, on the green sheet 2.

Figure 11:
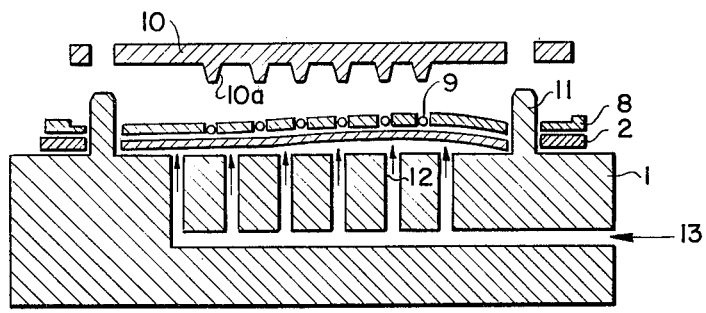
FIG. 11 shows a first embodiment of the present invention with one type of contact process.

FIG. 11 is a sectional view of a first embodiment of the present invention with one type of close contact process.

In this figure, reference numeral is the tray, 2 is a green sheet, 12 is a plurality of through holes formed in the tray 1, 13, represents a flow of pressurized air through the depicted conduit, 10a is a projected portion of a force piston 10 being provided at an area corresponding to holes of a ball arranging plate 8.

The green sheet 2 is placed on the tray 1 having the above-mentioned structure and with the ball arranging plate 8 on the green sheet. Pressurized air 13 is supplied from the through hole 12, and the soft green sheet 2 is freely deformed by the pressurized air, thereby causing the sheet to come into close contact with the surface of ball arranging plate 8. Even when the pressure of the air is comparatively small, close contact between the green sheet 2 and ball arranging plate 8 is assured.

When the green sheet 2 and the ball arranging plate 8 are placed in close contact, the balls 9 are arranged at the center of the holes provided on the ball arranging plate 8. Thus, the balls are correctly placed at the specified locations on the green sheet 2.

Moreover, since the pressured air 13 applies uniform pressure to all parts of the green sheet 2, the green sheet 2 is not damaged, unlike the case where it is placed in contact with a solid substance. In addition there is no local clearance between the green sheet and the ball arranging plate 8.

Figure 12:
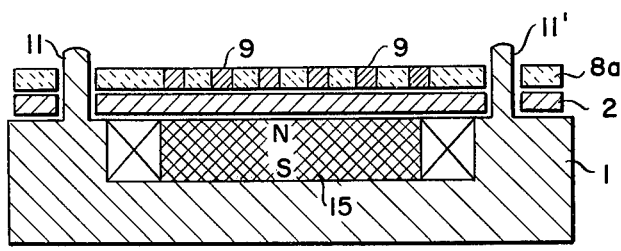
FIG. 12 is a second embodiment of the present invention with another type of contact process.

FIG. 12 is a sectional view of a second embodiment of the invention with yet another type of contact process. In this figure, reference numeral on 15 is electromagnet provided on the tray 1, 8a is a ball arranging plate consisting of a magnetic body, and the other reference numbers indicate the same elements as those in FIG. 2. The electro-magnet 15 is is level with the upper surface of the tray 1.

The green sheet 2 is provided at the specified position on the upper surface of the tray by means of the guide pins 11, 11'. Thereafter the ball arranging plate 8a is set at the specified position on the green sheet 2 through engagement with the guide pins 11, 11'.

Thereafter, the metallic balls 9 are inserted and arranged in holes on the ball arranging plate 8a.

Upon completing the arrangement of the metallic balls 9, a current is given to the electro-magnet 15 provided in the tray 1 and this magnet attracts the ball arranging plate 8a to the tray 1 with an electromagnetic force.

Since the ball arranging plate 8 is attracted to the tray 1 with a magnetic force, there is no clearance between the ball arranging plate 8a and the green sheet 2 because they are placed in close contact. Therefore, the metallic balls 9 are accurately positioned on the green sheet. Subsequently, the balls 9 are pressed by the force piston as in the embodiment of FIG. 11. Thus, the metallic balls 9 are accurately embedded into the green sheet 2 by means of the force piston pin without generating any dispacement. When embedding has been completed, the magnet 15 is released from activation, and thereby the ball arranging plate 8a and the green sheet 2 with the embedded metallic balls can be released easily.

The use of an electro-magnet simplifies the structure of tray 1 is simplified and the tray 1 requires no more than a power supply and switch as external elements.

Figure 13:
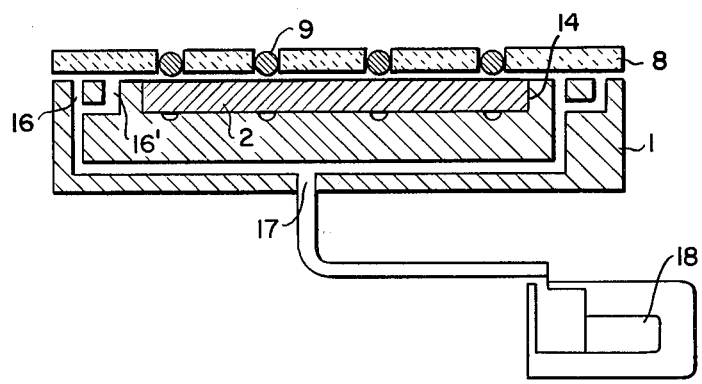
FIGS. 13 and 14 show a third embodiment of the present invention with yet another type of contact process, where
Figure 14:
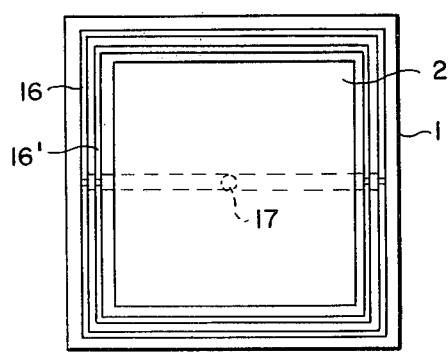

FIG. 13 and FIG. 14 show a third embodiment of the present invention with yet another type of contact process. Particularly, FIG. 13 is a vertical sectional view, and FIG. 14 is a plan view of the same apparatus.

In these figures, reference numerals 16, 16' are a double-ring groove provided at the upper surface of the tray 1, 14 in a recess formed in the tray for holding a green sheet 17 is a sucking hole operatively connected to the grooves 16, 16', 18 is a vacuum pump which gives a negative pressure to the sucking hole 17, and the other reference numbers indicate the same elements as those in FIG. 2.

Prior to the contact process using an apparatus of this structure, the green sheet 2 is placed in the recess area 14 in the tray 1 surrounded by the grooves 16, 16'. Then, the ball arranging plate 8 is mounted in such a manner to cover the green sheet 2 and the grooves 16, 16' on the tray 1.

Thereafter, the vacuum pump 18 is operated.

Thus, a negative pressure generated by the vacuum pump 18 is applied to the grooves 16, 16' through the sucking hole 17 and therefore the ball arranging plate 8 is attracted to the tray 1 and placed in close contact with the green sheet 2.

When the metallic balls 9 are located in the holes on the ball arranging plate 8 under this condition, the metallic ball 9 are located and positioned accurately.

As explained with reference to all of the foregoing three embodiments, in the contact process of the present invention, uniform close contact is assured between the green sheet 2 and ball arranging plate 8 and thereby a clearance between the green sheet 2 and ball arranging plate 8 can be eliminated. this makes it possible to the metallic balls at their accurate positions over the green sheet. When these accurately positioned metallic balls are embedded in the green sheet, and a plurality of green sheets are stacked to form the multi-layered substrate, displacement of metallic balls does not occur at the adjacent layer, thus assuring accurate electric continuity.

In this invention, it is required that the metallic balls, arranged on the green sheet 2, must all move vertically to the surface of tray 1 into the green sheet 2 and must be embedded sufficiently to ensure that both ends of the metallic balls are exposed to the green sheet 2.

Figure 15:
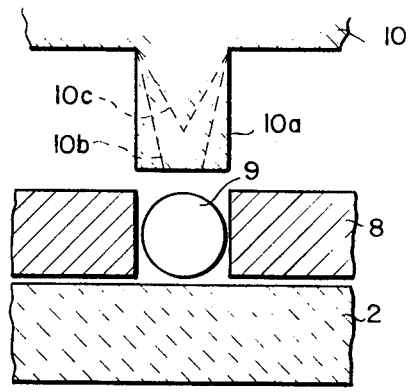
FIG. 15 shows the pin shape of the force piston used in the pressurization process of the present invention.

For this purpose, the force piston should have sufficient height and have a flat pin end. As shown in FIG. 15, if a tapered pin like 10b or 10c is used, as compared with the pin 10a, the metallic ball 9 cannot be embedded vertically with accuracy and the end of metallic ball 9 will not be exposed at the rear side of green sheet 2 due to an insufficient embedding distance.

Nevertheless, the required pin is preferably formed by chemical etching both for higher accuracy and reduced production cost. In such the case, since a pin is formed step by step from the end point to the root portion, the portions closer to the end point have a the longer dipping time in the chemical etching solution, and thus, the pin can become tapered or conically formed.

The present invention offer a preferred solution to this problem.

Namely, the present invention provides use of a photosensitive glass having a glass composition of $SiO_2$—$Li_2O$—$Al_2O_3$ as the material for forming the force piston. The desirable composition of this photo-sensitive glass is shown in the following table.

TABLE

| | |
|---|---|
| $SiO_2$ | 81.0 |
| $LiCO_3$ | 30.9 |
| $Al_2O_3$ | 4.3 |
| $KNO_3$ | 5.4 |
| $CeO_2$ | 0.03 |
| Au | 0.05 |

The raw material powder having the composition mentioned above is prepared in a platinum vessel, and the vessel is then heated at 1450° C. for three hours in order to fuse the powder. Thereafter, the fused material is transferred to a mold made of carbon and rapidly cooled. Thereby, the basic glass material of $SiO_2$—$Li_2O$—$Al_2O_3$ can be obtained.

After irradiating ultra-violet rays to acres of the piston other than the pin 10a of the glass base material using are irradiation mask, the material is heated for two hours under 620° C. and then it is etched by being dipped into a 10% fluoric acid solution. Thereby, a non-tapered pin can be formed.

The above-mentioned $SiO_2$—$Li_2O$—$Al_2O_3$ glass material shows a difference of solubility to the fluoric acid of about 30 times between these areas irradiated or not irradiated by the ultra-violet rays. Therefore, only the irradiated parts are etched while the non-irradiated parts are etched only very slightly. Therefore, the force piston having a pin in a fairly uniform cylindrical shape can be obtained.

Embedding of metallic balls 9 into the green sheet pushes aside the green sheet material in the same volume as that of the metallic balls.

Figure 16:
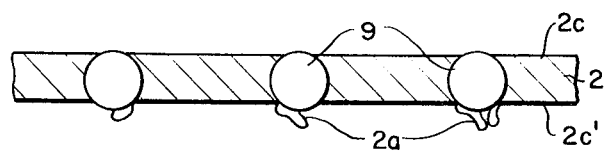
FIG. 16 is a sectional view of a green sheet embedded with the balls obtained after the pressurizing process of the present invention.

Thereby, as shown in FIG. 16, the sheet chip 2a often remains at the rear surface 2c' opposite to the ball inserting surface 2c of the green sheet 2 often embedding. If such a sheet chip 2a remains, faulty discontinuity will occur between the upper and lower patterns. Resultingly satisfactory via holes cannot be formed, degrading the yield on production and interfering with the multi-layer structure of the substrate.

Figure 17:
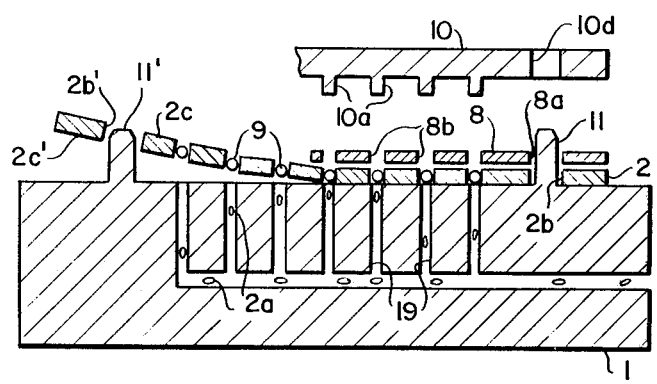
FIG. 17 shows the metal ball filling apparatus used in the pressurizing process of the present invention.
Figure 18:
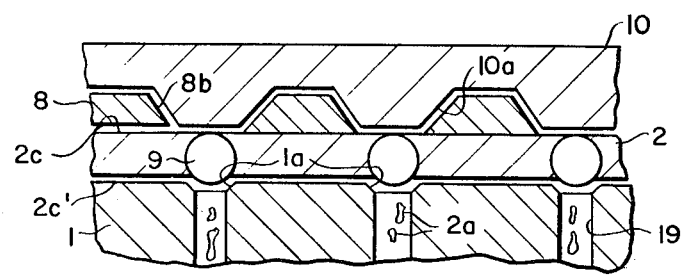
FIG. 18 is a partly enlarged sectional view of the apparatus of FIG. 17.

For this reason, such remaining sheet chips 2a must be removed and such removal can be done at the time of embedding the metallic balls in the present invention. FIG. 17 and FIG. 18 show an apparatus for embedding the metallic balls 9 and for removing the sheet chips 2a. FIG. 17 is a sectional view of the apparatus as a whole, while FIG. 18 is an enlarged sectional view of the apparatus portion in the vicinity of the metallic balls in FIG. 17.

As shown in FIG. 17, this metallic ball embedding apparatus 5 has a tray 1, with many dents or recesses 1a formed at the areas corresponding to the areas where the via holes must be formed as shown in FIG. 2. The dents 1a are provided with sucking holes or conduits 19 in such a way that, the conduits 19 are combined into one conduit within the tray 1 and connected with suitable sucking means, such as a vacuum pump. As shown in FIG. 17, the tray 1 is provided at the top with vertical guide pins 11, 11'. The green sheet 2 having an electric insulation property is positioned on the guide pins with freedom of engagement via the guide holes 2b and 2b'. The ball Arranging plate 8 is provided on the green sheet 2 with freedom of engagement with the guide pins 11, 11' via guide holes, such as 8a, and the ball arranging plate 8 is provided with many cylindrical positioning holes 8b in such a form to correspond to the dents 1a of the tray as shown in FIG. 18. The force piston 10 is provided over the ball arranging plate 8, as shown in FIG. 17, with freedom of engagement with the guide pins 11, 11' via guide hole 10d. The force piston 10 is also provided with many pins 10a in such a form to correspond to the positioning holes 8b of the ball arranging plate 8, and resultingly to the dent 1a of the tray 1 (FIG. 18).

Figure 19:
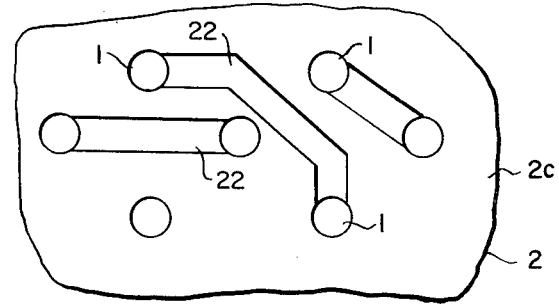
FIG. 19 is a plan view of a green sheet obtained after the pressurizing process of the present invention.

With the metallic ball arranging apparatus having the structure mentioned above, to form the via holes on the green sheet 2, as shown in FIG. 17, the green sheet 2 on which the via holes should be formed is set on the tray 1 with the guide holes 2b, 2b' being engaged with the guide pins 11, 11'. Moreover, the ball arranging plate 8 is also placed on the green sheet 2 while the guide holes 8a are engaged with the guide pins 11, 11'. Under this condition, as shown in FIG. 18, conductive metallic balls 9 consisting of gold Au are arranged one by one in the positioning holes 8b of the ball arranging plate 8 and then the force piston 10 is dropped downward as the guide holes 10d are engaged with the guide pins 11, 11'. Thereby, the pin 10a of the force piston 10 comes into contact with the metallic ball 9 in the positioning hole 8b. When the force piston 10 is further moved downward, the balls 9 are pressed into the specified via hole forming position on the green sheet 2 as they are guided by the cylindrical positioning hole 8b. At this time, as shown in FIG. 16, an extra sheet chip 2a is gradually pushed out at the surface of green sheet 2c' as the ball 9 is embedded into the sheet 2. As in FIG. 18, this chip 2a is pushed out onto dent 1a since the dent 1a is provided with sucking hole 19 connected to the sucking means, the sheet chip 2a is sucked through the sucking hole 19 and thereby the sheet chip does not remain on the green sheet 2. When the force piston 10 and the ball arranging plate 8 are coming into contact and the force piston 10 can no longer move downwardly, the metallic ball 9 is embedded at the specified position of the green sheet 2. Meanwhile, the sucking force of the sucking means working on the green sheet 2 via the sucking hole 19 absorbs the sheet chip 2a but the vacuum pressure is not so high as to effect the metallic ball 9 in the green sheet 2. Therefore, the metallic ball 9 is held at the specified position in the green sheet, namely at the location where a part of the ball 9 is equally exposed to the surfaces 2c and 2c' of the green sheet 2. Under this condition, as shown in FIG. 19, a pattern 22 which connects the metallic balls 9 is formed on the surface 2c of the green sheet and these completed substrates are then stacked and pressed into a multi-layer substrate body. Thereby, a pattern layer consisting of many patterns 22 is formed between the stacked green sheets 2 and the specified patterns are electrically connected by means of the metallic balls 9 at the adjacent patterns formed sandwiching between the green sheets 2. Since no sheet chips 2a remain on the green sheet 2, the metallic balls 9 are capable of accurately connecting the specified patterns. Finally, the multilayered green sheet 2 is baked under a high temperature and thereby a ceramic multilayer circuit substrate is completed.

The present invention is not limited to the particular embodiments described above. Individual elements of the embodiments could be combined. For example, the pressure air supply means used in the embodiment shown in FIG. 11 can also be used in parallel with the magnetic apparatus of the embodiment shown in FIG. 12. Moreover, the electro-magnet 15 used in the embodiment of FIG. 12 can also be added to the embodiment shown in FIG. 13.

What is claimed is:

1. A method of forming a ceramic circuit substrate comprising the steps of:
    (a) a mold setting process where a mold having many holes larger than the outer diameter of conductive balls is positioned over a green sheet placed on a tray;
    (b) a contact process where said green sheet and mold are placed in close contact;
    (c) a filling process where the conductive balls are filled in the holes on said mold;
    (d) a pressure embedding process where the conductive balls filled in the mold holes are embedded into the green sheet; and
    (e) a baking process where said green sheet is baked.

2. A method of forming a ceramic circuit substrate as claimed in claim 1, wherein said contact process includes supplying pressurized air between the green sheet and tray to urge said green sheet into close contact with said mold.

3. A method of forming a ceramic circuit substrate as claimed in claim 1, wherein said contact process includes using a mold consisting of a magnetic body and applying a magnetic force from said tray to said mold.

4. A method of forming a ceramic circuit substrate as claimed in claim 1, wherein said contact process includes forming a vacuum pressure between the mold and tray at an area outside the green sheet.

5. A method of forming a ceramic circuit substrate as claimed in claim 1 comprising the step of removing sheet chips formed from embedding the balls into said green sheet wherein said tray has sucking holes having a diameter smaller than the diameter of the conductive ball and corresponding to the embedding position of said balls in said green sheet.

6. A method of forming a ceramic circuit substrate as claimed in claim 5, wherein said embedding process includes applying a pressure force piston having projections corresponding to the holes of said mold into contact with the mold.

7. A method of forming a ceramic circuit substrate as claimed in claim 6, wherein said force piston is composed of a photo-sensitive glass material and the projections of the force piston are formed by chemical etching.

8. The method of claim 1, wherein the conductive balls are of a uniform size.

9. The method of claim 8, further comprising the step of forming the conductive balls from leads of metal cut into predetermined lengths corresponding to the required ball diameter.

10. The method of claim 9, wherein the ball forming step includes:
    (a) coating a bonding agent on a substrate;
    (b) arranging fine leads of gold (Au) on the substrate;
    (c) cutting the fine leads of gold into a predetermined length corresponding to the required ball diameter;
    (d) melting the leads of gold by heating at a predetermined rate to a predetermined temperature; and (e) solidifying the melted gold to form the balls by lowering the temperature at a predetermined rate.

11. The method of claim 10, wherein the gold is heated at an approximate rate of 700° C./hour to an approximate temperature of 1080° C. and the gold is solidified by lowering the temperature at an approximate rate of 500° C./hour.

12. The method of claim 1, 8 or 9, further comprising the step of removing sheet chips formed from embedding the balls into the green sheet.

13. The method of claim 12, further comprising stacking green sheets embedded with the balls together and thereafter baking the green sheets to form a multi-layered ceramic substrate.

14. The method of claim 1, further comprising stacking green sheets embedded with the balls together and thereafter baking the green sheets to form a multi-layered ceramic substrate.

15. The method of claim 1, wherein the embedding process is a pressure and heat embedding process.

16. The method of claim 15, wherein in the embedding process heat is applied at a temperature range of between 80°–100° C. and pressure is applied at a pressure range of between 100 to 150 Kg/cm$^2$.

17. The method of claim 1, 2, 3, 4, or 5, wherein said mold comprises a ball-arranging plate having a thickness substantially the same as the diameter of the conductive balls.

18. The method of claim 17, wherein the conductive balls are of a uniform diameter.

19. The method of claims 6 or 7, wherein the ends of the force piston projections are flat and the projections have a substantially uniform cylindrical shape for ensuring a vertical embedding of the balls into the correct location on the green sheet.

* * * * *

UNITED STATES PATENT AND TRADEMARK OFFICE
CERTIFICATE OF CORRECTION

PATENT NO. : 4,346,516

DATED : Aug. 31, 1982

INVENTOR(S) : Yokouchi et al.

Figure 9:

It is certified that error appears in the above-identified patent and that said Letters Patent is hereby corrected as shown below:

```
Front page, after "[22] Filed: Apr. 8, 1981" insert
     --[30] Foreign Application Priority Data
     May 26, 1980 [JP] Japan ... 55-69818--;
Front Page, [57] Abstract,
     line 7, after "layers;" insert --placing--;
     line 8, delete "placing";
     line 10, delete "embedding the"; after "balls" insert
     --; embedding the conductive balls--.
Column 1, line 46, delete "an";
Column 1, line 68, ":" should be --.--.
Column 2, line 15, "it" should be --It--;
Column 2, line 46, after "is" delete "the";
Column 2, line 48, after "view" insert --,--.
Column 3, line 26, after "of" insert --these--;
Column 3, line 34, after "in" insert --the--; before "man-"
     delete "the";
Column 3, line 41, delete "raw";
Column 3, line 45, after "In" delete ",";
Column 3, line 49, after "time" insert --,--;
Column 3, line 55, "the" (first occurrence) should be --a--.
Column 4, line 32, "referred" should be --preferred--;
Column 4, line 35, "referred" should be --preferred--;
Column 4, line 65, after "lengrh" insert --,--.
Column 5, line 41, "abovementioned" should be
     --above-mentioned--;
Column 5, line 47, "phenomenona" should be --phenomena--;
Column 5, line 62, "FIG. 2" should be --FIG. 9--;
Column 5, line 65, "ball" should be --balls--.
Column 6, line 2, delete "the";
Column 6, line 15, after "numeral" insert --1--;
Column 6, line 23, after "8" insert --placed--;
Column 6, line 44, "on 15 is" should be --15 is an--;
Column 6, line 48, delete "is" (either occurrence).
```

UNITED STATES PATENT AND TRADEMARK OFFICE
CERTIFICATE OF CORRECTION

PATENT NO. : 4,346,516
DATED : Aug. 31, 1982
INVENTOR(S) : Yokouchi et al.

It is certified that error appears in the above-identified patent and that said Letters Patent is hereby corrected as shown below:

```
Column 7, line 3, "dispacement" should be --displacement--;
Column 7, line 8, delete "is simplified";
Column 7, line 16, after "14" change "in" to --is--;
Column 7, line 17, after "sheet" insert --,--;
Column 7, line 36, "ball 9" should be --balls 9--;
Column 7, line 42, "this" should be --This--; after "to" insert
      --arrange--;
Column 7, line 45, after "sheet" delete ",";
Column 7, line 65, "the case, since a" should be --a case,
      since the--;
Column 7, line 67, after "a" delete "the".
Column 8, line 25, "acres" should be --areas--;
Column 8, line 26, after "pin" insert --portion--;
Column 8, line 44, "often" should be --after--;
Column 8, line 47, after "ingly" insert --,--;
Column 8, line 60, after "1" delete ",";
Column 8, line 64, after "that" delete ",".
Column 9, line 3, "Arranging" should be --arranging--;
Column 9, line 8, after "tray" insert --,--;
Column 9, line 38, after "1a" change "since" to --. Since--.
```

Signed and Sealed this

First Day of February 1983

[SEAL]

Attest:

Attesting Officer

GERALD J. MOSSINGHOFF

Commissioner of Patents and Trademarks